United States Patent
Lo et al.

(10) Patent No.: US 9,297,713 B2
(45) Date of Patent: Mar. 29, 2016

(54) PRESSURE SENSOR DEVICE WITH THROUGH SILICON VIA

(71) Applicants: Wai Yew Lo, Petaling Jaya (MY); Lan Chu Tan, Singapore (SG)

(72) Inventors: Wai Yew Lo, Petaling Jaya (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 17 days.

(21) Appl. No.: 14/220,121

(22) Filed: Mar. 19, 2014

(65) Prior Publication Data

US 2015/0270206 A1  Sep. 24, 2015

(51) Int. Cl.
*H01L 29/84* (2006.01)
*G01L 9/00* (2006.01)
*H01L 23/48* (2006.01)
*H01L 23/00* (2006.01)
*H01L 25/16* (2006.01)
*H01L 23/31* (2006.01)
*H01L 21/56* (2006.01)

(52) U.S. Cl.
CPC .............. *G01L 9/00* (2013.01); *H01L 23/3107* (2013.01); *H01L 23/481* (2013.01); *H01L 24/17* (2013.01); *H01L 24/81* (2013.01); *H01L 24/97* (2013.01); *H01L 25/165* (2013.01); *H01L 21/561* (2013.01); *H01L 2224/13023* (2013.01); *H01L 2224/13025* (2013.01); *H01L 2224/1624* (2013.01); *H01L 2224/16055* (2013.01); *H01L 2224/16113* (2013.01); *H01L 2224/16145* (2013.01); *H01L 2224/45144* (2013.01); *H01L 2224/48091* (2013.01); *H01L 2224/48137* (2013.01); *H01L 2224/48157* (2013.01); *H01L 2924/12042* (2013.01); *H01L 2924/143* (2013.01); *H01L 2924/146* (2013.01); *H01L 2924/181* (2013.01); *H01L 2924/1815* (2013.01)

(58) Field of Classification Search
USPC ......................................................... 257/417
See application file for complete search history.

(56) References Cited

U.S. PATENT DOCUMENTS

| | | | |
|---|---|---|---|
| 4,314,225 A | | 2/1982 | Tominaga |
| 5,604,363 A | | 2/1997 | Ichihashi |
| 5,625,209 A | | 4/1997 | Appleton |
| 5,692,637 A | | 12/1997 | Hodge |
| 5,719,069 A | | 2/1998 | Sparks |
| 5,811,684 A | | 9/1998 | Sokn |
| 5,831,170 A | | 11/1998 | Sokn |
| 5,859,759 A | | 1/1999 | Moriyama |
| 5,874,679 A | | 2/1999 | Sokn |
| 5,996,419 A | | 12/1999 | Sokn |
| 6,094,356 A | | 7/2000 | Fujisawa |
| 6,150,724 A | * | 11/2000 | Wenzel ............... H01L 25/0657 257/724 |
| 6,266,197 B1 | | 7/2001 | Glenn |
| 6,351,996 B1 | | 3/2002 | Nasiri |
| 6,401,545 B1 | | 6/2002 | Monk |
| 6,492,699 B1 | * | 12/2002 | Glenn ............... H01L 27/14618 257/433 |
| 6,566,168 B2 | | 5/2003 | Gang |
| 6,667,439 B2 | | 12/2003 | Salatino |
| 6,900,531 B2 | | 5/2005 | Foong |

(Continued)

*Primary Examiner* — Thao P Le

(74) *Attorney, Agent, or Firm* — Charles E. Bergere

(57) ABSTRACT

A semiconductor pressure sensor device having a pressure-sensing die electrically connected to a microcontrol unit (MCU) using either through silicon vias (TSVs) or flip-chip bumps. An active surface of the pressure-sensing die is in facing relationship with the MCU. These embodiments avoid the need to used bonds to electrically connect the pressure-sensing die to the MCU, thereby saving time, reducing size, and reducing cost.

10 Claims, 6 Drawing Sheets

(56) References Cited

U.S. PATENT DOCUMENTS

| | | | |
|---|---|---|---|
| 6,927,482 B1 | 8/2005 | Kim | |
| 7,014,888 B2 | 3/2006 | MacDonald | |
| 7,462,940 B2 | 12/2008 | Bauer | |
| 7,469,590 B2 | 12/2008 | Fukuda | |
| 7,541,681 B2 * | 6/2009 | Otremba | H01L 23/3107 |
| | | | 257/778 |
| 7,549,344 B2 | 6/2009 | Yamamoto | |
| 7,568,390 B2 | 8/2009 | Shizuno | |
| 7,632,698 B2 | 12/2009 | Hooper | |
| 7,673,519 B1 | 3/2010 | Fuhrmann | |
| 7,705,242 B2 | 4/2010 | Winterhalter | |
| 7,875,942 B2 | 1/2011 | Cortese | |
| 7,886,609 B2 | 2/2011 | Lo | |
| 8,035,235 B2 | 10/2011 | Jang | |
| 8,359,927 B2 | 1/2013 | Hooper | |
| 8,378,435 B2 | 2/2013 | Lo | |
| 8,390,047 B2 | 3/2013 | Jain | |
| 8,405,115 B2 | 3/2013 | Samoilov | |
| 8,597,983 B2 | 12/2013 | Gong | |
| 2004/0014266 A1 | 1/2004 | Uno | |
| 2004/0187977 A1 | 9/2004 | Matsui | |
| 2004/0245320 A1 | 12/2004 | Fukagaya | |
| 2005/0236644 A1 | 10/2005 | Getten | |
| 2006/0012053 A1 * | 1/2006 | Lai | H01L 25/167 |
| | | | 257/778 |
| 2007/0023873 A1 | 2/2007 | Park | |
| 2007/0269933 A1 * | 11/2007 | Hooper | G01L 19/141 |
| | | | 438/127 |
| 2007/0298276 A1 | 12/2007 | Teshima et al. | |
| 2008/0030205 A1 * | 2/2008 | Fujii et al. | 324/661 |
| 2008/0050267 A1 | 2/2008 | Murai | |
| 2009/0072399 A1 | 3/2009 | Terashima | |
| 2009/0211784 A1 | 8/2009 | Grogl | |
| 2012/0168884 A1 | 7/2012 | Yao | |
| 2012/0306031 A1 | 12/2012 | Lo | |
| 2013/0049182 A1 | 2/2013 | Gong | |
| 2013/0207207 A1 * | 8/2013 | McDonald | G01L 19/0069 |
| | | | 257/415 |
| 2013/0277772 A1 | 10/2013 | Bryzek | |

* cited by examiner

US 9,297,713 B2

PRESSURE SENSOR DEVICE WITH THROUGH SILICON VIA

BACKGROUND OF THE INVENTION

The present invention relates generally to semiconductor sensor devices and, more particularly, to a pressure sensor device with a Through Silicon Via (TSV).

Semiconductor sensor devices, such as pressure sensor devices, are well known and used for many applications such as for measuring tire pressure in automobiles. Semiconductor pressure-sensing dies are susceptible to mechanical damage during packaging and environmental damage when in use, and thus they must be carefully packaged. Further, pressure-sensing dies (a.k.a. P-cells), such as piezo resistive transducers (PRTs) and parameterized layout cells, do not permit full encapsulation because that would impede their functionality.

Existing pressure sensor devices use bond wires to connect the pressure-sensing die to a microcontrol unit (MCU). However, using bond wires to connect a P-cell to an MCU has certain disadvantages. For instance, there are reliability issues associated with using bond wires, since the wires are covered with a pressure-sensitive gel instead of a mold compound, which can result in kinking or breaking of the bond wires.

There are also high packaging costs associated with using bond wires such as larger cavity sizes being needed to enable wire bonding. Because there are larger cavity sizes, the package size increases and therefore the amount of pressure-sensitive gel used to fill the cavity increases. Pressure-sensitive gel is expensive, which increases the overall cost of manufacture. Also, using bond wires increases manufacturing time because additional steps are required to perform the wire bonding.

BRIEF DESCRIPTION OF THE DRAWINGS

Embodiments of the present disclosure are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present disclosure are disclosed herein. However, specific structural and functional details disclosed herein are merely representative for purposes of describing example embodiments of the present disclosure. Embodiments of the present disclosure may be embodied in many alternative forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

There is a need to reduce costs of assembling pressure sensor devices by eliminating the need to use bond wires to connect the MCU and the pressure sensor, especially the use of gold wires. Eliminating the need for wire bonding will streamline the process steps and reduce the amount of pressure-sensitive gel that is required. Reducing the amount of pressure-sensitive gel used will further reduce the costs of manufacturing the pressure sensor devices.

In one embodiment, the present invention is a semiconductor sensor device comprising a lead frame, a MCU attached to a flag of the lead frame and electrically connected to leads of the lead frame, and a pressure-sensing die electrically connected to the MCU without using any bond wires.

In another embodiment, the present invention provides a method for assembling a semiconductor sensor device. The method includes attaching a MCU to a lead frame flag, electrically connecting the MCU to leads of the lead frame, and electrically connecting a pressure-sensing die to the MCU without using bond wires.

Figure 1:
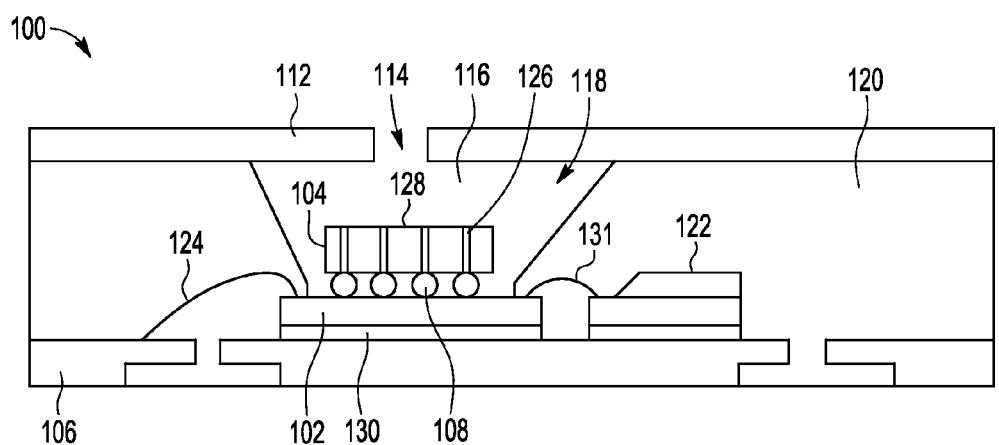
FIG. 1 is a cross-sectional side view of a pressure sensor device in accordance with an embodiment of the disclosure.

Referring now to FIG. 1, a cross-sectional side view of a semiconductor sensor device 100 in accordance with an embodiment of the present invention is shown. The exemplary configuration of the sensor device 100 forms a package such as a quad flat no-leads (QFN) package. Note that alternative embodiments are not limited to QFN packages, but can be implemented for other package types, such as (without limitation) quad flat pack (QFP) or other leaded packages, ball grid array (BGA) packages, and molded array packages (MAP).

The sensor device 100 comprises a MCU 102, which is a die that may control the operations of and processing signals generated by sensor dies. The MCU 102 is electrically connected to a P-cell 104, which is the pressure sensing die. By "electrical connection" or "electrically connected" it is meant that electronic signals may be transmitted from one die to the other by way of a connection. A pressure-sensing die is an integrated circuit that generates electronic signals based on atmospheric pressure. The pressure-sensing die is generally referred to herein as the P-cell 104 for the remainder of the application, however it should be understood that any pressure-sensing die may be used. It is contemplated that, in some embodiments, the MCU 102 may implement both the functionality of an MCU and that of one or more other sensors, such as a G-cell.

The P-cell 104 is designed to sense ambient atmospheric pressure. Such pressure-sensing dies are known in the art. The sensor device 100 may also comprise an acceleration-sensing die (a.k.a. G-cell) 122, which is electrically connected to the MCU 102. The G-cell 122 is designed to sense gravity or acceleration in one, two, or all three axes, depending on the particular implementation. The P-cell 104, MCU 102, and G-cell 122 are well-known components of semiconductor sensor devices and thus detailed descriptions thereof are not necessary for a complete understanding of the disclosure.

In the embodiment shown in FIG. 1, the MCU 102 is mounted to a flag of a lead frame 106, which, in the embodiment shown, is a QFN type lead frame. The MCU 102 is electrically connected to leads of the lead frame 106 using one or more bond wires, such as (e.g., gold-based) bond wire 124. For Example 1.3 mil gold wires may be used. For example, the bond wires 124 may also be formed from a different conductive material such as aluminum or copper, and may be either coated (i.e., insulated), uncoated (i.e., uninsulated), or plated. In embodiments comprising a G-cell 122, the G-cell 122 may be attached to the lead frame flag and electrically connected to the MCU 102 using one or more bond wires, such as bond wire 131. Both the MCU 102 and the G-cell 122 may be attached to the lead frame flag using a conventional, electrically insulating die-attach adhesive 130. Those skilled in the art will understand that suitable alternative means, such as die-attach tape, may be used to attach some or all of these dies.

A cavity 118 is formed over the MCU 102 by molding compound 120. The bond wires 124, 131 are encapsulated within the molding compound 120. The molding compound 120 may be a plastic, an epoxy, a silica-filled resin, a ceramic, a halide-free material or the like, or combinations thereof, as is known in the art. In the finished package, the cavity 118 is filled with a pressure-sensitive gel 116 that covers the P-cell 104. The pressure sensitive gel material 116 may be deposited by filling most of the cavity 118 formed by the molding compound 120 around the P-cell 104. The gel 116 may be dispensed with a nozzle of a conventional dispensing machine, as is known in the art. Note that, in alternative implementations, less of the gel 116 may be applied within the recess as long as the pressure-sensitive active region 128 of the P-cell 104 is covered. The pressure-sensitive gel 116 enables the pressure of the ambient atmosphere to reach the active region 128 of the P-cell 104, while protecting the P-cell 104 from (i) mechanical damage during packaging and (ii) environmental damage (e.g., contamination and/or corrosion) when in use. Examples of suitable pressure-sensitive gel 116 are available from Dow Corning Corporation of Midland, Mich. In the embodiments shown in FIGS. 1 and 3, the pressure-sensitive gel 116 may be, for example, DC4939 silicone gel.

A lid 112 has a vent hole 114 formed therein that permits ambient air to interact with the pressure-sensitive gel 116. The lid 112 is mounted over the gel-covered P-cell 104 providing a protective cover for the P-cell 104. The vent hole 114 allows the ambient atmospheric pressure immediately outside the sensor device 100 to reach (i) the pressure-sensitive gel 116 and therethrough (ii) the active region 128 of the P-cell 104. Although shown centered in FIG. 1, the vent hole 114 can be located anywhere within the area of the lid 112. The vent hole 114 may be formed in the lid 112 by a suitable fabrication process such as drilling or punching. The lid 112 may be formed of a durable and stiff material, such as stainless steel, plated metal, or polymer, so that the P-cell 104 is protected. The lid 112 is sized and shaped depending on the size and shape of the P-cell 104 mounted to the lead frame under the lid. Accordingly, depending on the implementation, the lid 112 may have any suitable shape, such as round, square, or rectangular.

Still referring to FIG. 1, the P-cell 104 is formed with through silicon vias (TSVs) 110, which are filled with an electrically conductive TSV material 126 to connect the upper active region 128 located on the upper portion of the P-cell 104 (according to the orientation of FIG. 1) to the MCU 102. The TSV material 126 may be any suitable electrical conducting material, such as copper or solder material (e.g., tin). In the embodiment shown in FIG. 1, the TSV material 126 is further connected to bumps 108, which electrically connect the TSV material 126 to the MCU 102.

Using the TSVs 110 permits the electrical connection of the active region 128 of the P-cell 104 to the MCU 102 without the use of wire bonding. This enables the cavity 118 to be smaller, thereby requiring less of the pressure-sensitive gel 116, further reducing assembly steps, and removing the cost of the bond wires, all of which reduce overall costs.

The cross-sectional side view of FIG. 1 shows four TSVs 110 in the P-cell 104. The P-cell 104 may have other TSVs that are not shown in FIG. 1. In general, a pressure sensor device of the present disclosure may have one or more TSVs arranged in any suitable one- or two-dimensional pattern. Typically, there will be one TSV for each different electronic signal to be transmitted between P-cell 104 and MCU 102. As for the TSVs themselves, it is now understood by those of skill in the art how to fabricate a semiconductor integrated circuit with TSVs.

Figure 2A:
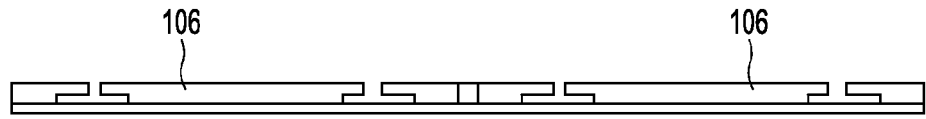
FIGS. 2A-2F are cross-sectional views of different stages during the process of assembling the pressure sensor device of FIG. 1.
Figure 2B:
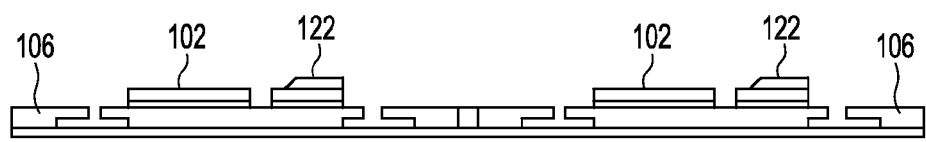

FIGS. 2A-2F show cross-sectional views of different stages of an assembly process of the sensor device 100 shown in FIG. 1. FIGS. 2A-2F show the assembly of two of the sensor devices 100. In FIG. 2A, the lead frame 106 is taped in order to permit the placement and assembly of dies used in the construction of the sensor device 100. In FIG. 2B, MCUs 102 and G-cells 122 are attached (die bonding step) to a flag of the lead frame 106 and then the die attach adhesive is cured such as by oven curing.

Figure 2C:
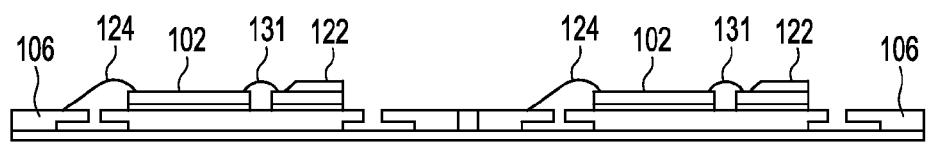

Referring to FIG. 2C, the surface of the existing sub-assembly is plasma cleaned to prepare it for a wire bonding process. After cleaning of the sub-assembly, the MCUs 102 are electrically connected to leads of the lead frame and to their corresponding G-cells 122 with bond wires.

Figure 2D:
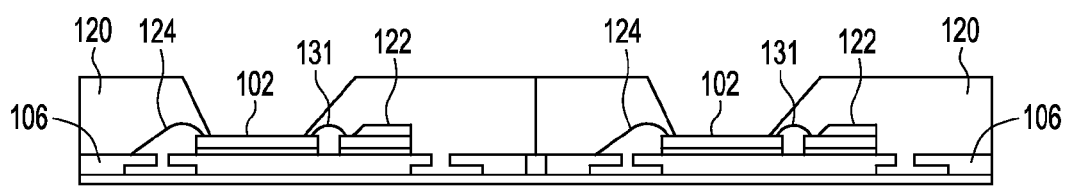

Referring to FIG. 2D, during the assembly process a trapezoidal-shaped pin is placed on the top surface of each MCU 102 in order to form trapezoidal-shaped cavities 118. After the trapezoidal pins are placed, molding compound 120 is used to fill the sub-assemblies and form around the pins in order to create the cavities 118. The molding compound 120 is typically applied as a liquid polymer, which is then heated to form a solid by curing in a UV or ambient atmosphere. The molding compound 120 can also be a solid that is heated to form a liquid for application and then cooled to form a solid mold. Subsequently, an oven is used to cure the molding compound 120 to complete the cross-linking of the polymer. The trapezoidal-shaped pins are removed at an appropriate time, leaving behind the cavities 118.

Figure 2E:
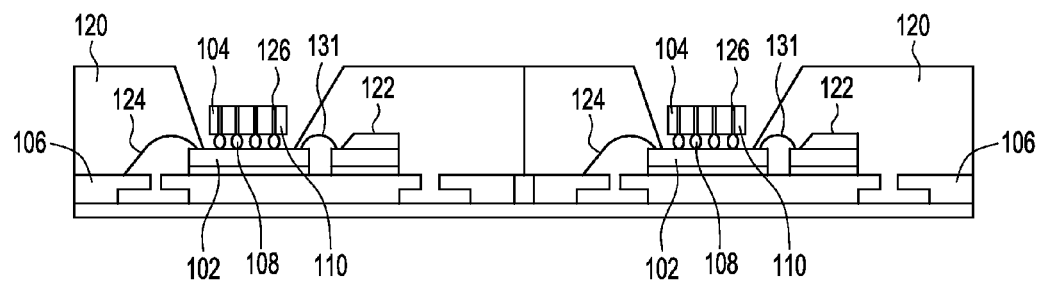

In FIG. 2E, each P-cell 104 is placed on and electrically connected to the corresponding MCU 102, such as with solder balls using an oven reflow process. The P-cell 104 has an active region 128 located at the top portion of the P-cell 104 facing up in the orientation of FIG. 1. The P-cell 104 has TSVs 110 that have TSV material 126 that electrically connects the active region 128 of the P-cell 104 to the MCU 102. In the embodiment shown, bumps 108 are located between I/O pads (not shown) on the top surface of the MCU 102 and on the bottom surface of the P-cell 104 and contact both. The bumps 108 may be attached to the P-cell 104 before being electrically connected to the MCU 102 or vice-versa. The bumps 108 may include solder bumps, gold balls, copper balls, molded studs, or combinations thereof. By using the TSVs 110, there is no need to provide an additional wire bonding step to electrically connect the P-cell 104 to the MCU 102. This saves time in assembly, reduces space in the sensor device 100, and reduces the cost of assembly.

Figure 2F:
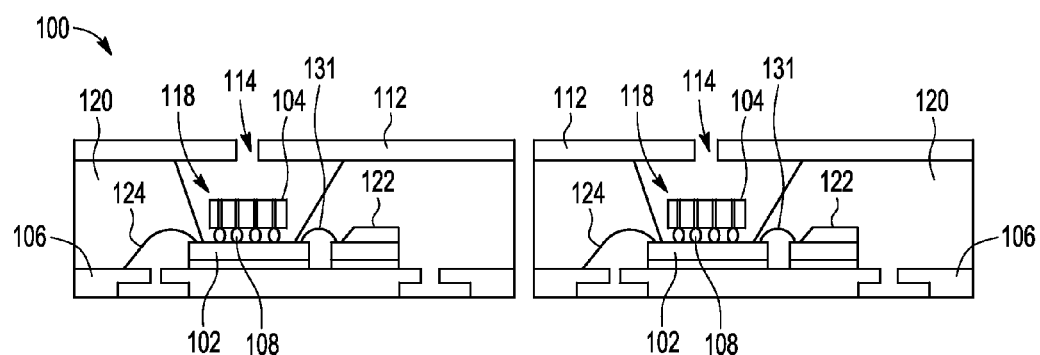

Referring to FIG. 2F, each cavity 118 of the sub-assembly is then filled with the pressure-sensitive gel 116 and cured.

The lid 112 is then placed and attached, the sub-assembly is de-taped, and the assembly undergoes a singulation process where it is sawed or subjected to laser cutting in order to create the individual sensor devices 100.

Figure 3:
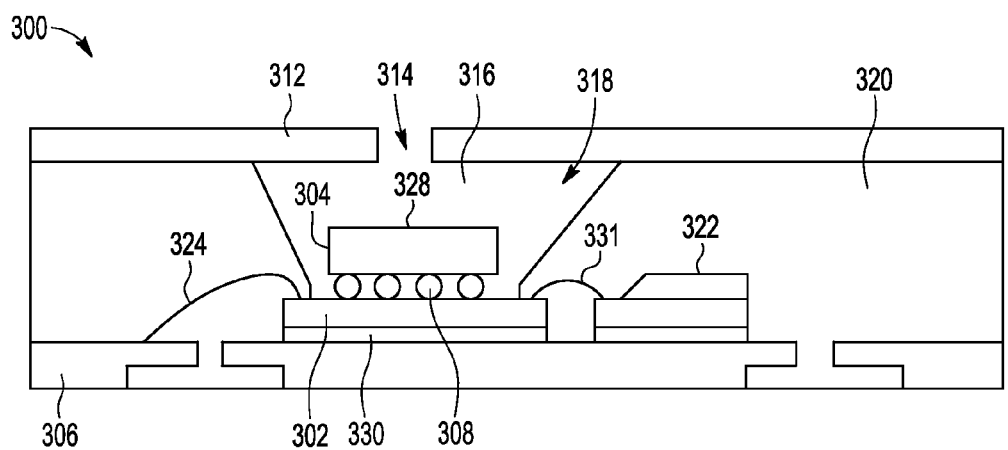
FIG. 3 is a cross-sectional side view of a pressure sensor device in accordance with another embodiment of the disclosure.

Now turning to FIG. 3, another embodiment of the present invention is shown. FIG. 3 shows a sensor device 300. Similar numbered elements shown in FIG. 3 are analogous to those referred to in FIGS. 1 and 2A-2F discussed above, those differences between the sensor device 100 and the sensor device 300 will be discussed below in more detail.

In FIG. 3, the sensor device 300 uses a P-cell 304 that is a flip chip, instead of using wire bonds or TSVs. Using a flip-chip P-cell 304 means that the active region 328 of the P-cell 304 is facing the top surface of MCU 302, instead of facing the lid 312, as the P-cell 104 does in sensor device 100 of FIG. 1.

The P-cell 304 is electrically connected through bumps 308 to the MCU 302. The bumps 308 may include solder bumps, gold balls, copper balls, molded studs, or combinations thereof. The bumps 308 may be formed or placed on a semiconductor die using known techniques such as evaporation, electroplating, printing, jetting, stud bumping, and direct placement. The P-cell 304 is flipped, and the bumps are aligned with corresponding contact pads of the MCU 102.

Referring to FIGS. 4A-4F, the assembly process is similar to that discussed above with respect to FIGS. 2A-F. Similarly, there is no need for a wire bonding step of the MCU 302 to the P-cell 304.

Figure 4A:
FIGS. 4A-4F are cross-sectional views of different stages during the process of assembling the pressure sensor device of FIG. 3.
Figure 4B:
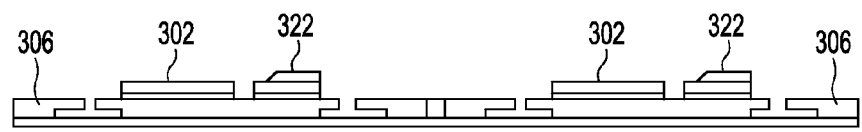
Figure 4C:
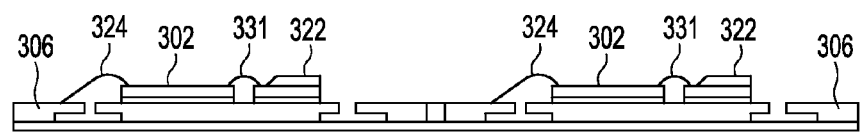
Figure 4D:
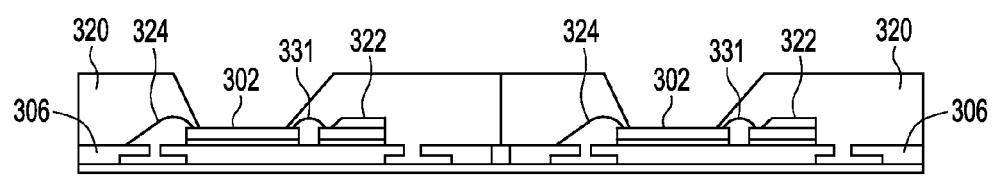
Figure 4E:
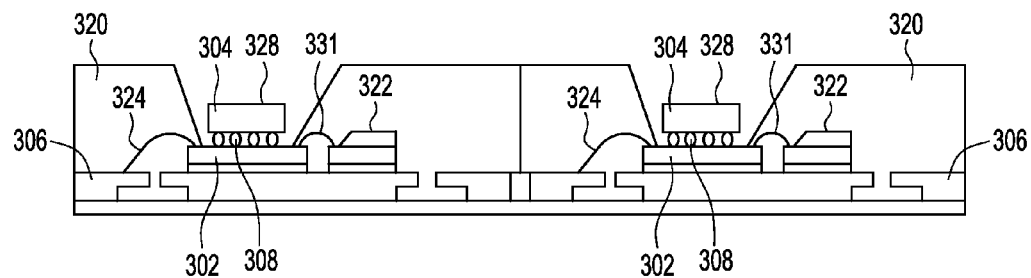
Figure 4F:
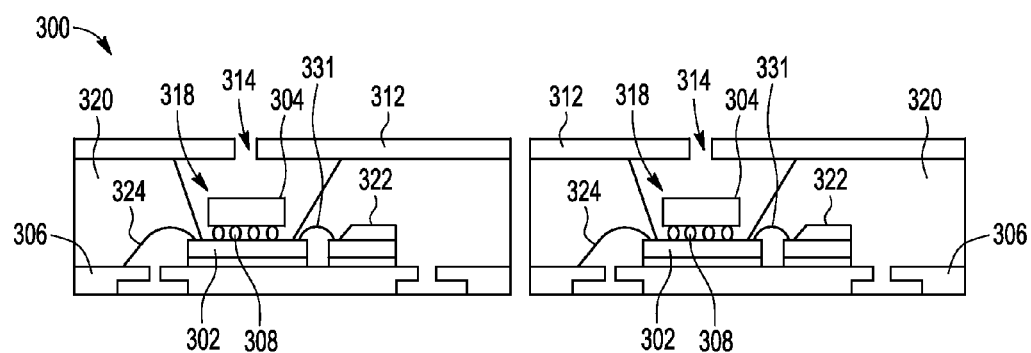

The differences between the assembly of the sensor 100 shown in FIGS. 2A-2F and the assembly of the sensor 300 shown in FIGS. 4A-4F may be found in FIGS. 4E and 4F, where a flip-chip type P-cell 304 is installed with the active region 328 facing the top surface of MCU 302. This avoids the need for wire bonding and allows electrical connection from the P-cell 304 to the MCU 302 to occur using bumps 308. Similar to the method shown in FIGS. 2A-2F, this permits the assembly to be reduced in size, requiring less pressure sensitive gel 316, and further reducing time to manufacture by removing steps of curing, plasma cleaning, and wire bonding the P-cell 304 to the MCU 302.

Note that, since the pressure-sensitive region on the bottom of P-cell 304 faces away from the opening 314 in lid 312, the bumps 308 must be designed and configured to allow ambient pressure to reach the P-cell's pressure-sensitive region through the intervening gel material 218.

Although the figures show sensor devices 100, 300 having a P-cell and a G-cell, those skilled in the art will understand that, in alternative embodiments, the G-cell and its corresponding bond wires may be omitted. Furthermore, certain embodiments may have one or more other dies as appropriate.

By now, it should be appreciated that there has been provided an improved packaged semiconductor pressure sensor device and an improved method of forming such packaged semiconductor pressure sensor device. Circuit details are not disclosed because knowledge thereof is not required for a complete understanding of the invention.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the disclosure is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor sensor device, comprising:
  a lead frame having a die flag and leads spaced from and located on at least one side of the die flag;
  a microcontrol unit (MCU) attached to the die flag and electrically connected to the leads;
  a pressure-sensing die, mounted on a top surface of the MCU, and having an active region on a top surface thereof that is facing away from the MCU, and at least one through silicon via (TSV) extending from the active region to an opposite bottom surface, and electrically connected to bond pads on the top surface of the MCU without using any bond wires; and
  conductive bumps or pillars located between the bottom surface of the pressure-sensing die and the top surface of the MCU, and electrically connecting the active region of the pressure-sensing die to the bond pads on the top surface of the MCU via the at least one TSV.

2. The semiconductor sensor device of claim 1, wherein the pressure-sensing die is at least partially covered with a pressure-sensitive gel.

3. The semiconductor sensor device of claim 2, wherein the MCU die and its electrical connections to the leads are covered with a molding compound and a cavity is formed in the mold compound over the MCU, wherein the pressure-sensing die and the pressure-sensitive gel are located within the cavity.

4. The semiconductor sensor device of claim 3, further comprising a lid covering the cavity, wherein the lid has a hole therein.

5. The semiconductor sensor device of claim 1, further comprising a G-cell attached to the die flag and electrically connected to the MCU.

6. A method for assembling a semiconductor sensor device, the method comprising:
- attaching a microcontrol unit (MCU) to a flag of a lead frame;
- electrically connecting the MCU to leads of the lead frame; and
- mounting a pressure-sensing die on a top surface of the MCU, wherein the pressure-sensing die has an active region on a top surface thereof that faces away from the MCU, and wherein the pressure-sensing die comprises at least one through silicon via (TSV) extending from the active region to an opposite bottom surface of the pressure-sensing die; and
- electrically connecting the at least one TSV at the bottom surface of the pressure sensing die to bond pads on the top surface of the MCU using conductive bumps or pillars located between the bottom surface of the pressure sensing die and the top surface of the MCU, wherein the at least one TSV forms an electrical connection between the active region of the pressure-sensing die and the bond pads on the top surface of the MCU.

7. The method of claim 6, further comprising:
- applying molding compound over the MCU and the lead frame and forming a cavity in the molding compound, wherein the pressure-sensing die is placed on the MCU within the cavity; and
- at least partially filling the cavity with pressure-sensitive gel to cover an active region of the pressure-sensing die.

8. The method of claim 7, further comprising placing a lid comprising a hole over the gel filled cavity.

9. The method of claim 6, further comprising attaching a G-cell to the lead frame flag and electrically connecting the G-cell to the MCU.

10. A semiconductor sensor device manufactured in accordance with the method of claim 6.

* * * * *